United States Patent [19]

Nightingale et al.

[11] Patent Number: 4,607,776
[45] Date of Patent: Aug. 26, 1986

[54] APPARATUS FOR TRANSLATING CRYSTAL FIBERS

[75] Inventors: John L. Nightingale, Woodside; Martin M. Fejer, Atherton; Robert L. Byer, Stanford, all of Calif.

[73] Assignee: The Board of Trustees of The Leland Stanford, Junior University, Stanford, Calif.

[21] Appl. No.: 645,839

[22] Filed: Aug. 31, 1984

[51] Int. Cl.⁴ .......................................... B65H 20/00
[52] U.S. Cl. .................................... 226/171; 422/249
[58] Field of Search .................. 422/249; 156/617 M, 156/621, DIG. 80, DIG. 98, DIG. 64; 198/725, 735, 836, 837; 226/170, 171

[56] References Cited

U.S. PATENT DOCUMENTS 2,333,278 11/1943 Truesdail ............................ 226/170
4,108,714 8/1978 Keller et al. ................. 156/DIG. 64
4,421,721 12/1983 Byer et al. ........................... 422/109

FOREIGN PATENT DOCUMENTS 79004 1/1971 Fed. Rep. of Germany ... 156/DIG. 98
917950 1/1947 France ................................. 226/170
284080 1/1971 U.S.S.R. .............................. 226/171

OTHER PUBLICATIONS

C. H. Bowman, Multiple Wire Feeder, IBM Technical Disclosure Bulletin, vol. 13, No. 3, Aug. 1970, pp. 600-601.

Primary Examiner—David L. Lacey
Attorney, Agent, or Firm—Flehr, Hohbach, Test, Albritton & Herbert

[57] ABSTRACT

Translation apparatus for a crystal fiber includes a resilient belt which receives a crystal fiber in pressure engagement. The fiber is supported against the belt by a support member having a grooved surface for receiving the fiber. A floating block is positioned within a loop of the belt and is offset in the loop when the support member and fiber are brought into engagement with the belt.

4 Claims, 9 Drawing Figures

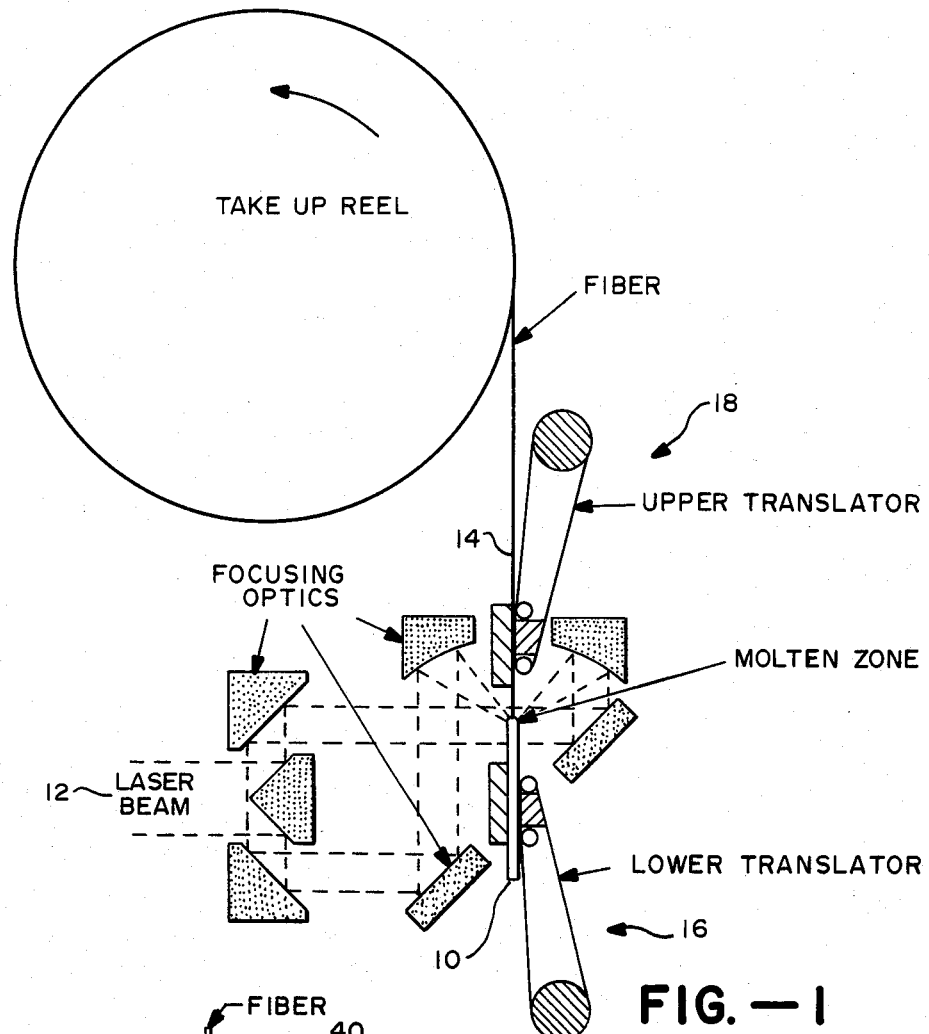
FIG.—1
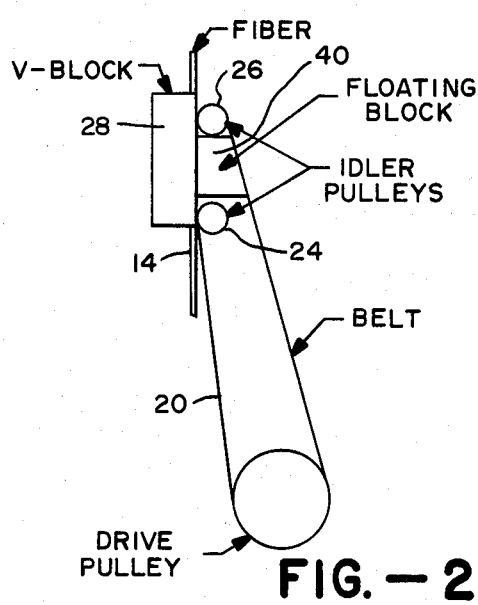
FIG.—2A
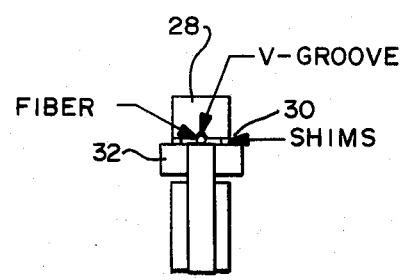
FIG.—2B

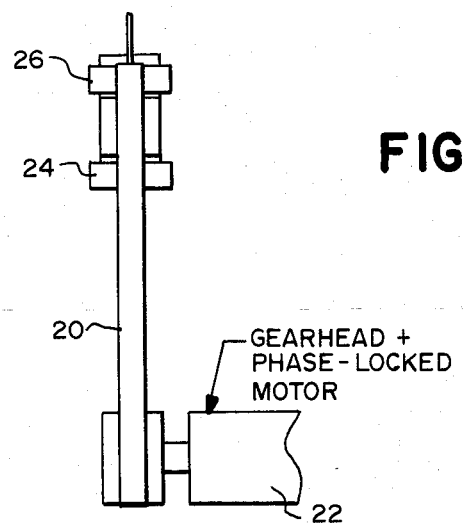
FIG. —2C
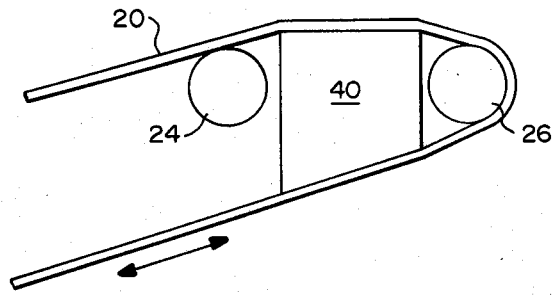
FIG. —3A
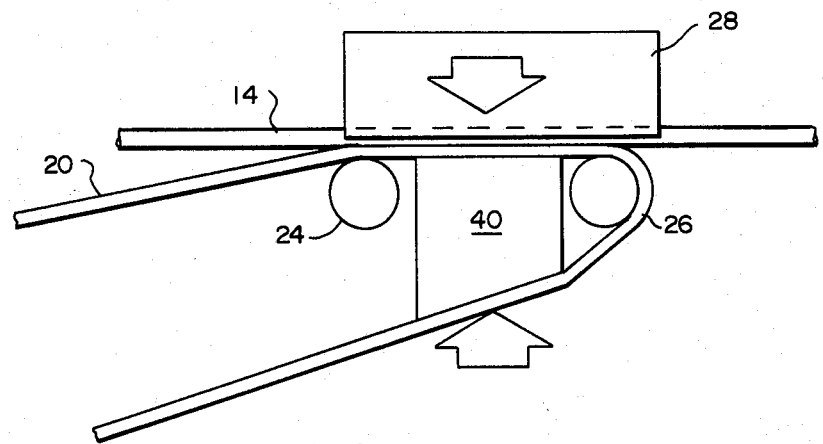
FIG. —3B

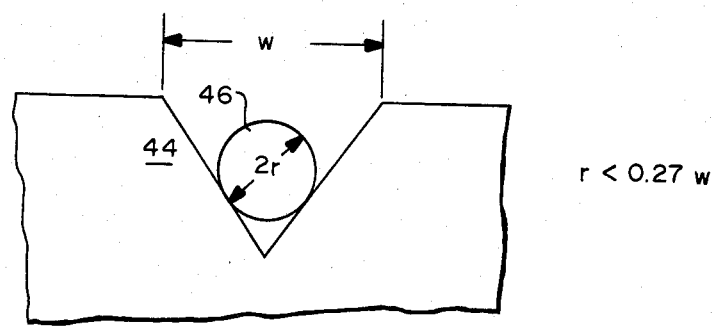
FIG. —4A
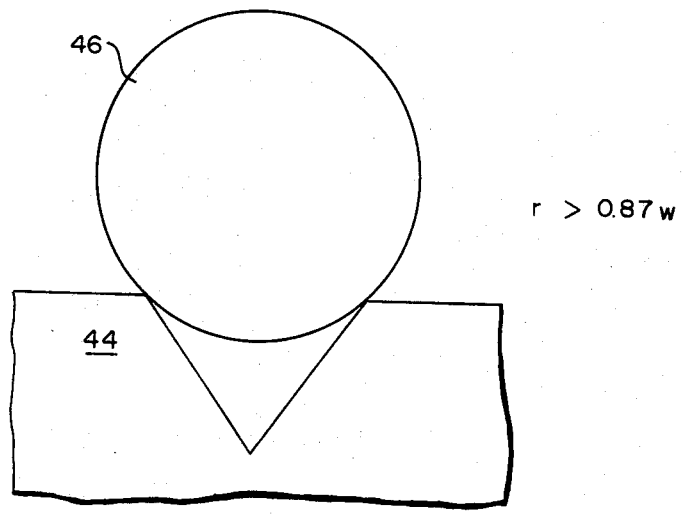
FIG. —4B
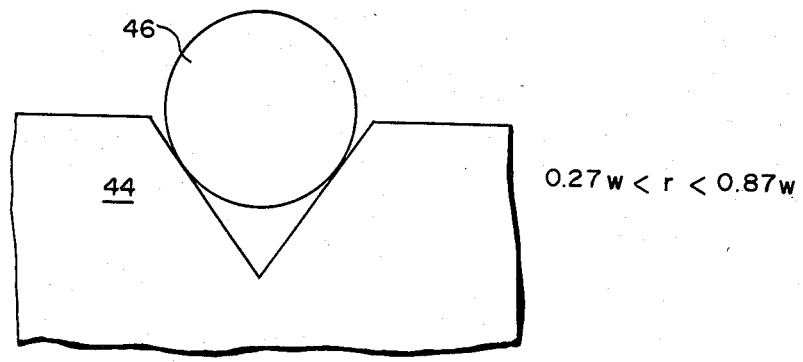
FIG —4C

APPARATUS FOR TRANSLATING CRYSTAL FIBERS

The U.S. has rights in this invention pursuant to Contract No. 83-0193 with the U.S. Air Force Office of Scientific Research.

This invention relates generally to apparatus for growing crystal fibers, and more particularly the invention relates to apparatus for translating crystal fibers as they are grown.

Single crystal fibers are presently being studied for use in a variety of optical applications. The unique combination of single crystal materials properties and fiber geometry offer intriguing capabilities in a variety of optical devices. The large non-linear coefficients of $LiNbO_3$ suggests a number of modulators, signal processors, and parametric sources. Miniature lasers made from Nd:YAG fibers are known and could be used as in line amplifiers in conjunction with conventional glass fiber systems. Sapphire has a high melting point, mechanical strength, resistance to chemical attack, and favorable optical fiber properties which make it an excellent candidate for monitoring temperature or optical radiation in hostile environments and for guiding high power optical beams.

Apparatus presently in use for growing crystal fibers utilizes a pair of laser beams focused on the end of a rod. A seed crystal is dipped into the molten bead formed on the rod, and then the seed crystal is withdrawn at a constant rate to pull a single crystal fiber. Both the rod and seed crystal are chucked to lead screws, and the feed rate of the rod and the pull rate of the seed crystal are adjusted to achieve a desired fiber cross section. Typically, a diameter reduction of two to five is feasible, and by using three to five regrowth cycles a fiber can be obtained having a diameter less than 100 microns. Fibers have been grown with diameters ranging from 500 microns down to 35 microns in lengths up to 15 centimeters. Growth rates are typically 1-10 millimeter per minute. However, the length of the lead screw imposes a maximum length on the grown fibers.

U.S. Pat. No. 4,421,721 for "Apparatus for Growing Crystal Fibers" discloses apparatus for growing crystal fibers including optical means for receiving and expanding a laser beam into a generally annular configuration and focusing the laser beam on the end of a crystal feed rod. A vacuum chuck and roller are employed to translate the crystal fiber from the molten portion of the rod.

The present invention is directed to an improvement in the apparatus for translating crystal fibers. A belt drive is provided for translating the fibers. Preferably, a grooved surface of a support member receives the fiber and maintains the fiber in forced contact with the belt. The belt is preferably made of a resilient material such as a polyester cord reinforced urethene belt which deformably receives the crystal fiber. In a preferred embodiment the support member comprises a silicon body having an anisotropically etched V-groove with the surface coated with a layer of silicon oxide, thus providing a smooth and hard sliding surface along the fiber axis. Varying fiber diameters are accommodated through the use of different width V-grooves and through the use of shims for spacing of the support member from the belt.

To facilitate the pressure contact of the fiber and the belt surface, a floating block is provided in a looped portion of the belt with the block thickness being greater than the loop spacing. As the support member engages the belt, the block is displaced in the loop with the belt pressure on the block being translated to and exerted against the support member and fiber.

A unique feature of the invention is the provision of a support point for the fiber which is fixed in space, thereby ensuring mechanical stability at the growth zone even for long fiber lengths.

The invention and objects and features thereof will be more readily apparent from the following detailed description and appended claims when taken with the drawing, in which:

FIG. 1 is a schematic diagram of crystal fiber drawing apparatus including fiber translation apparatus in accordance with the invention.

FIGS. 2A-2C are a side view, end view, and top view, respectively, of the fiber translation apparatus of FIG. 1.

FIGS. 3A and 3B illustrate the function of a floating block in the fiber translation apparatus.

FIGS. 4A-4C illustrate support members having too large a groove, too small a groove, and an optimum groove, respectively, for receiving and guiding a crystal fiber.

Referring now to the drawings, FIG. 1 schematically illustrates crystal fiber growth apparatus in which a source rod 10 is heated by focused laser beam 12 using focusing optics as disclosed in U.S. Pat. No. 4,421,721, supra. The source rod 10 provides the feed material for crystal growth and may be fabricated from either single crystal, polycrystalline, or hot pressed powder material. The focused laser beam 12 melts the upper end of the source rod, and an oriented seed rod 14 is dipped into the molten zone to initiate growth of the crystal fiber. The seed rod 14 defines the crystallographic orientation of the fiber. Growth proceeds by simultaneously translating the lower source rod and the fiber 14 by means of a lower translator shown generally at 16 and an upper translator shown generally at 18. Conservation of mass determines the fiber diameter reduction as the square root of the feed rate to pull rate ratio. Typical fiber growth rates range from 0.1 to 40 millimeter/minute with diameter reductions of approximately 3:1.

In order to achieve a smooth fiber free of defects, stable fiber growth conditions must be realized. Variations in parameters such as the fiber pull rate, source feed rate, and fiber/source position orthagonal to the growth direction can all lead to variations in fiber uniformity. Thus, growth of a high optical quality single crystal fiber requires a smooth and stable translation system for the fiber and source rod.

FIGS. 2A-2C are a side view, end view, and top view, respectively, of the fiber translation apparatus 16, 18 of FIG. 1. The apparatus includes a belt 20 which is driven by a phase locked motor 22 through a suitable gearhead and around idler pulleys 24 and 26. Support member 28 has a V-groove in one surface thereof which receives the fiber 14 and maintains the fiber in pressure engagement with the belt 20. In a preferred embodiment the support member 28 comprises a body of silicon having one surface with [100] crystallographic orientation. The surface is preferentially etched to define the V-groove of suitable width for receiving the fiber 14, as will be discussed further hereinbelow. To maintain proper spacing of the support member 28 from the belt and thus accommodate crystal fibers of different diameters, shims 30 are positioned between the support member 28 and a housing 32 for the belt 20 and idler pulleys 24, 26.

Advantageously, a floating block 40 is provided in the looped portion of the belt 20 to facilitate the pressure engagement of the support member and fiber with the belt 20. The floating block 40, which may comprise an aluminum body coated with teflon, has a width which is greater than the spacing of the belt loop. In FIG. 3A the block 40 is in a position of pressure equilibrium with the top and bottom portions of the looped belt. In FIG. 3B the support member 28 and fiber 14 are moved into engagement with the belt 20 and the block 40 is displaced downwardly until the pressure exerted by the support member 28 is equally opposed by pressure from the lower portion of belt 20, as indicated. Importantly, the upward pressure on the belt 20 in opposition to the pressure from support member 28 is carried by the floating block 40 and not the rollers 24 and 26.

The floating block dimensions are such that the belt drive is bent around the floating block as illustrated in FIG. 3A. With the fiber in place the floating block is displaced from its equilibrium position as shown in FIG. 3B. The taut drive belt on the right side of the floating block acts like a spring, trapping the fiber between the V block and drive belt. The strength of this spring is controlled by the floating block displacement which is governed by shim thickness.

The maximum V-groove size for a given fiber diameter is set by the constraint that some portion of the fiber be exposed above the V-groove for engaging the belt. In FIG. 4A a side view of a support member 44 is illustrated in which the V-groove is too large for the diameter of fiber 46. The minimum V-groove size is set by requiring that the fiber rests within and not on top of the V-groove as illustrated in FIG. 4B. FIG. 4C illustrates the optimum V-groove width, w, for a fiber 46 having a radius r. For an anistropically etched silicon V-groove the angle at the V-groove base is 70.53°, and the acceptable V-groove width (w) for a circular fiber radius (R) is $$1.25r < W < 3.71r$$

or $$0.27W < R < 0.87W$$

The fiber translation system in accordance with the present invention allows the growth of fibers whose length is limited only by the dimensions of the initial feed rod.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A fiber translation apparatus comprising:
   a resilient belt, said belt including a loop and a floating block within said loop,
   a support member positioned adjacent said belt for receiving and supporting a crystal fiber against said resilient belt, said support member including a grooved surface for receiving said crystal fiber,
   said floating block having a width which is greater than the spacing of said loop whereby said block is offset in said loop when said support member and fiber are brought into engagement with said belt, and
   drive means for translating said resilient belt.

2. Translation apparatus as defined by claim 1 wherein said support member comprises a body of silicon with a silicon oxide coating on said grooved surface.

3. Translation apparatus as defined by claim 2 wherein said grooved surface includes a V-groove formed by anisotropically etching said surface of said support member.

4. Translation apparatus as defined by claim 1 wherein said belt comprises polyester cord reinforced urethane.

* * * * *